US012615881B2

(12) United States Patent
Haushalter et al.

(10) Patent No.: US 12,615,881 B2
(45) Date of Patent: Apr. 28, 2026

(54) OPTOELECTRONIC COMPONENT INCLUDING A POTTING FRAME

(71) Applicant: ams-OSRAM International GmbH, Regensburg (DE)

(72) Inventors: Martin Haushalter, Regensburg (DE); Dirk Becker, Langquaid (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 398 days.

(21) Appl. No.: 18/042,766

(22) PCT Filed: Sep. 16, 2021

(86) PCT No.: PCT/EP2021/075434
§ 371 (c)(1),
(2) Date: Feb. 23, 2023

(87) PCT Pub. No.: WO2022/063668
PCT Pub. Date: Mar. 31, 2022

(65) Prior Publication Data
US 2023/0317874 A1 Oct. 5, 2023

(30) Foreign Application Priority Data

Sep. 25, 2020 (DE) ..................... 10 2020 125 056.8

(51) Int. Cl.
*H10H 20/01* (2025.01)
*H01S 5/183* (2006.01)
(Continued)

(52) U.S. Cl.
CPC ............. *H10H 20/01* (2025.01); *H01S 5/183* (2013.01); *H10H 20/852* (2025.01);
(Continued)

(58) Field of Classification Search
CPC .. H01S 5/183; H01S 5/02253; H01S 5/02234; H01S 5/02257; H10H 20/852; H10H 20/855; H10H 20/0362
(Continued)

(56) References Cited

U.S. PATENT DOCUMENTS 6,111,272 A     8/2000  Heinen
6,849,881 B1    2/2005  Harle et al.
(Continued)

FOREIGN PATENT DOCUMENTS

EP        0905797 A2    3/1999
EP        2216834 A1    8/2010
(Continued)

*Primary Examiner* — Eliseo Ramos Feliciano
*Assistant Examiner* — Mikka Liu
(74) *Attorney, Agent, or Firm* — Slater Matsil, LLP

(57) ABSTRACT

In an embodiment an optoelectronic component includes an optoelectronic semiconductor chip, an optical element and a chip carrier, wherein the semiconductor chip is arranged on the chip carrier, wherein the optical element is arranged downstream of the semiconductor chip in a radiation direction and is attached to an optic carrier by an adhesive layer, wherein a potting forms a frame around the optical element, the optic carrier and the adhesive layer which extends from the optical element to the optic carrier, wherein the potting fixes the optical element in its position relative to the semiconductor chip, wherein the optic carrier and the chip carrier are one piece, and wherein the optic carrier at least partially surrounds the semiconductor chip laterally as seen in the radiation direction.

4 Claims, 7 Drawing Sheets

(51) Int. Cl.
      *H10H 20/852*      (2025.01)
      *H10H 20/855*      (2025.01)

(52) U.S. Cl.
      CPC ....... *H10H 20/855* (2025.01); *H10H 20/0362*
             (2025.01); *H10H 20/0363* (2025.01)

(58) Field of Classification Search
      USPC ............................................ 257/79, 99–100
      See application file for complete search history.

(56)            References Cited

U.S. PATENT DOCUMENTS

| | | | |
|---|---|---|---|
| 6,995,030 B2 | 2/2006 | Illek et al. | |
| 9,947,844 B1 * | 4/2018 | West ...................... | H10H 20/83 |
| 2010/0264438 A1 * | 10/2010 | Suenaga ............. | H10H 20/851 |
| | | | 257/98 |
| 2012/0039064 A1 * | 2/2012 | Ooyabu ............. | H10H 20/8583 |
| | | | 362/84 |
| 2018/0315907 A1 * | 11/2018 | Chiu ................... | H10H 20/857 |

FOREIGN PATENT DOCUMENTS

| | | | |
|---|---|---|---|
| WO | 0139282 A2 | 5/2001 | |
| WO | 0213281 A1 | 2/2002 | |

* cited by examiner

OPTOELECTRONIC COMPONENT INCLUDING A POTTING FRAME

This patent application is a national phase filing under section 371 of PCT/EP2021/075434, filed Sep. 16, 2021, which claims the priority of German patent application 102020125056.8, filed Sep. 25, 2020, each of which is incorporated herein by reference in its entirety.

TECHNICAL FIELD

An optoelectronic component is disclosed. In addition, a method of manufacturing an optoelectronic component is disclosed.

SUMMARY

Embodiments provide an optoelectronic component that is characterized by long durability and high mechanical robustness. Further embodiments provide a method for manufacturing such a component.

According to at least one embodiment of the optoelectronic component, the optoelectronic component comprises an optoelectronic semiconductor chip, an optical element and a chip carrier. For example, the semiconductor chip comprises a semiconductor layer sequence having an active region. For example, the semiconductor layer sequence comprises a p-type semiconductor layer and an n-type semiconductor layer, with the active region disposed between the p-type layer and the n-type layer. The active layer serves to generate or absorb electromagnetic radiation. In particular, the active zone includes at least one quantum well structure in the form of a single quantum well, abbreviated as SQW, or in the form of a multi-quantum well structure, abbreviated as MQW. Additionally, the active zone includes one, preferably more, secondary well structures. Examples of MQW structures are described in the publication WO 01/39282, the disclosure content of which is hereby incorporated by reference.

For example, electromagnetic radiation in the blue or green or red spectral range or in the UV range or in the IR range is generated in the active zone during intended operation. In particular, it is possible that electromagnetic radiation in a wavelength range between including the IR range and including the UV range is generated in the active zone.

For example, the semiconductor layer sequence is based on an III-V compound semiconductor material. For example, the semiconductor layer sequence is based on a nitride compound semiconductor material, such as $AlnIn1-n-mGamN$, or on a phosphide compound semiconductor material, such as $AlnIn1-n-mGamP$, or on an arsenide compound semiconductor material, such as $AlnIn1-n-mGamAs$, where $0 \leq n \leq 1$, $0 \leq m \leq 1$, and $m+n \leq 1$, respectively. Thereby, the semiconductor layer sequence may comprise dopants as well as additional components. For the sake of simplicity, however, only the essential constituents of the crystal lattice of the semiconductor layer sequence, i.e. Al, As, Ga, In, N or P, are indicated, even if these may be partially replaced and/or supplemented by small amounts of additional substances.

A semiconductor chip is understood here and in the following in particular as an element that can be separately handled and electrically contacted. A semiconductor chip is created in particular by separation from a wafer composite. The semiconductor layer sequence of the semiconductor chip is formed in a connected manner, for example.

Alternatively, it is possible for the semiconductor chip to comprise a multiple connected semiconductor layer sequence. Separate sections of the semiconductor layer sequence are arranged on a common carrier, for example. Each section of the semiconductor layer sequence preferably forms an emitter and is configured to emit electromagnetic radiation. Thus, the semiconductor chip comprises, for example, a plurality of emitters. The emitters are arranged in a so-called array, for example.

According to at least one embodiment of the optoelectronic component or its embodiment described above, the semiconductor chip is arranged on the chip carrier. The chip carrier comprises, for example, one or more metallizations on a surface facing the semiconductor chip. Alternatively or additionally, the chip carrier has one or more through-connections. In intended operation, the semiconductor chip is supplied with current and controlled in particular via the chip carrier. For example, the chip carrier is formed with a fired ceramic, for example AlO or AlN.

Alternatively, the chip carrier is formed, for example, with a lead frame that is encapsulated with a plastic potting as a potting body. The lead frame comprises copper, for example. Such chip carriers are referred to as QFN substrates, for example.

According to at least one embodiment of the optoelectronic component or one of its embodiments described above, the optical element is arranged downstream of the semiconductor chip in a radiation direction of the semiconductor chip. The radiation direction of the semiconductor chip is in particular the direction in which electromagnetic radiation emitted by the semiconductor chip in intended operation has its greatest intensity.

For example, the optical element is configured for beam shaping. For example, the optical element is configured in such a way that radiation emitted by the semiconductor chip during intended operation is focused. Alternatively, the optical element is configured for beam expansion, for example. Furthermore, it is possible that the optical element is configured for complex beam shaping, for example for generating a dot pattern.

The optical element comprises, for example, a plurality of lenses arranged in an array. The lenses are, for example, microlenses. In this case, the optical element is in particular a so-called microlens array. In the case where the semiconductor chip comprises a plurality of emitters, the optical element is preferably a microlens array.

Alternatively, the optical element is formed with a single lens.

For example, the optical element is formed with a glass, a polymer, or a composite of at least one polymer and at least one glass.

According to at least one embodiment of the optoelectronic component or one of its embodiments described above, the optical element is attached to an optic carrier by means of an adhesive layer. The adhesive layer comprises, for example, an epoxy-based adhesive or a silicone-based adhesive. Alternatively or additionally, the adhesive layer is based on at least one other suitable polymer. For example, the adhesive layer comprises an acrylate.

According to at least one embodiment of the optoelectronic component or one of its embodiments described above, as viewed in the radiation direction, a potting forms a frame around the optical element that extends from the optical element at least in places via the adhesive layer to the optic carrier. The frame encloses the optical element, the optic carrier and the adhesive layer, for example, at least partially. In particular, the frame completely encloses the optical element, the optic carrier and the adhesive layer as viewed in the radiation direction. The potting is in direct contact with the optical element, the optic carrier, the adhesive layer, for example. In particular, the potting is in direct contact with the chip carrier. For example, the potting is based on an epoxy or on a silicone. For example, the potting comprises a base material in which a filler is embedded. The filler is for example SiO2.

According to at least one embodiment of the optoelectronic component or one of its embodiments described above, the potting fixes the optical element in its position relative to the semiconductor chip. For example, the potting is materially bonded to the optical element, the optic carrier and the adhesive layer as well as the chip carrier. In particular, the optical element is bonded to the chip carrier in such a way that the position of the optical element can only be changed by destroying the bond, i.e. the potting. Since the semiconductor chip is arranged on the chip carrier, the potting fixes the optical element with respect to the semiconductor chip.

In at least one embodiment, the optoelectronic component comprises an optoelectronic semiconductor chip, an optical element, and a chip carrier. The semiconductor chip is arranged on the chip carrier. The optical element is disposed downstream of the semiconductor chip in a radiation direction of the semiconductor chip and is attached to an optic carrier by an adhesive layer. A potting forms a frame around the optical element, the optic carrier and the adhesive layer, which extends from the optical element to the optic carrier. The potting fixes the optical element in its position relative to the semiconductor chip.

An optoelectronic component described here is based, inter alia, on the following technical peculiarities. Existing optoelectronic components that require beam shaping usually use an optic carrier with a glued optical element. However, this adhesive bond conventionally exhibits low reliability. Due to mismatched thermal expansion coefficients between the optic carrier and the optical element, cracks may appear in the adhesive bond due to thermal aging effects. These aging processes cause the adhesion between the components to decrease. In extreme cases, the optical element and/or the optic carrier can fall off, which means in particular that the function of the component is lost. For this reason, the optical elements and/or optic carriers are usually secured with a separate second adhesive bond.

The optoelectronic component described here makes use, inter alia, of the idea of at least partially encasing the optical element and/or the optic carrier with a potting. The potting creates a material bond between the optical element, the optic carrier and the chip carrier. As a result, the optical element and the optic carrier are fixed to the chip carrier and the reliability of the optoelectronic component can be increased. Further safety mechanisms to prevent the optical element from falling off can advantageously be omitted.

According to at least one embodiment of the optoelectronic component or one of its embodiments described above, side surfaces of the optical element are at least partially tilted towards the radiation direction, as seen in the radiation direction. Side surfaces of the optical element are, in particular, surfaces of the optical element that connect a front side of the optical element facing away from the semiconductor chip to a back side of the optical element facing the semiconductor chip. For example, side surfaces or portions of side surfaces include an acute angle with the rear cross-sectional surface of the optical element. In particular, the front side comprises a smaller cross-sectional area than the back side in a cross-section parallel to a main extension plane of the optical element. For example, a width of the optical element measured perpendicular to the radiation direction decreases in the radiation direction. In particular, the width of the optical element decreases continuously in the radiation direction. For example, in a section through the optical element along the radiation direction, the optical element is trapezoidal.

According to at least one embodiment of the optoelectronic component or one of its embodiments described above, the potting is arranged on the side surfaces of the optical element. For example, the potting is arranged directly at the side surfaces. In the case of side surfaces of the optical element that are tilted towards the radiation direction, the optical element can be particularly well fixed by the potting, which further increases the robustness of the component.

According to at least one embodiment of the optoelectronic component or one of its embodiments described above, the front side of the optical element is free of the adhesive layer and the potting. Thus, possible negative effects of the potting or the adhesive layer on radiation properties of the optoelectronic component can be reduced.

According to at least one embodiment of the optoelectronic component or one of its embodiments described above, the optic carrier and the chip carrier are formed in one piece. In particular, the optic carrier is formed with the same material as the chip carrier.

According to at least one embodiment of the optoelectronic component or one of its embodiments described above, the optic carrier at least partially surrounds the semiconductor chip laterally as seen in the radiation direction. In particular, the semiconductor chip is surrounded by the optic carrier in all directions perpendicular to the radiation direction. Preferably, the semiconductor chip is spaced from the optic carrier and/or the optical element. For example, the optic carrier together with the optical element, the adhesive layer and the chip carrier form an enclosure completely surrounding the semiconductor chip, in particular a closed housing for the semiconductor chip. Alternatively, it is possible for the optic carrier together with the optical element, the adhesive layer and the chip carrier to form a housing that comprises one or more openings.

According to at least one embodiment of the optoelectronic component or one of its embodiments described above, the optic carrier comprises at least one recess on a side facing away from the semiconductor chip. In particular, the potting has at least one protrusion. For example, the recess of the optic carrier and the protrusion of the potting correspond to each other. In particular, the at least one protrusion of the potting engages in the at least one recess of the optic carrier. By this is meant that the recess and the protrusion engage with each other according to a lock-and-key principle and the protrusion fills the recess in particular completely. Preferably, the recess and the protrusion form a form fit. Advantageously, this allows the mechanical stability of the optoelectronic component to be further increased.

According to at least one embodiment of the optoelectronic component or one of its embodiments described above, the optic carrier is formed by the semiconductor chip, i.e., the semiconductor chip also functions as an optic carrier. For example, the optical element is arranged on a surface of the semiconductor chip facing away from the chip carrier. In particular, only the adhesive layer is arranged between the optical element and the semiconductor chip.

According to at least one embodiment of the optoelectronic component or the last described embodiment, the potting at least partially covers flanks of the semiconductor chip. Flanks of the semiconductor chip are formed by surfaces which connect the surface of the semiconductor chip facing the chip carrier with the surface of the semiconductor chip facing the optical element. For example, flanks of the semiconductor chip are completely covered by the potting. For example, flanks of the semiconductor chip are directly covered by the potting. For example, all flanks of the semiconductor chip that are not in contact with the chip carrier or the adhesive layer are covered by the potting.

According to at least one embodiment of the optoelectronic component or one of its embodiments described above, the semiconductor chip is a surface-emitting light-emitting diode chip or a surface-emitting laser diode chip.

If the semiconductor chip is a surface-emitting laser diode chip, the laser diode chip preferably comprises at least one vertically arranged resonator. This means in particular that a main extension direction of the resonator is parallel to the radiation direction. Such laser diode chips are also referred to as "vertical-cavity surface-emitting lasers", or VCSELs for short.

In particular, in the case where the semiconductor chip comprises a plurality of emitters, each of the emitters is formed as a surface-emitting light-emitting diode unit or a surface-emitting laser diode unit. Preferably, each laser diode unit includes a vertically disposed resonator. In other words, each emitter comprises a vertically arranged resonator and is configured to emit laser radiation in operation. In this case, for example, the semiconductor chip is formed of an array of VSCELs, in other words a VCSEL array.

In the case where the semiconductor chip is a surface-emitting light-emitting diode chip, the semiconductor chip is, for example, a light-emitting diode chip, such as a thin film light-emitting diode chip. Examples of light-emitting diode chips, in particular thin film light-emitting diode chips, are described in WO 01/39282, EP 0905797 A2 and WO 02/13281 A1, the disclosure content of which is also incorporated by reference to this extent.

A method of manufacturing an optoelectronic component is further disclosed. The optoelectronic component described herein and embodiments thereof can be manufactured in particular by the method. That is, all features disclosed for the component are also disclosed for the method, and vice versa.

According to at least one embodiment of the method, a substrate having a plurality of cutouts is provided. At least one optoelectronic semiconductor chip is placed in each of the cutouts. For example, the semiconductor chips are placed in the cutouts using silver conductive bonding, silver sintering, or soldering. For example, side surfaces of the cutouts, which extend transversely to a main extension plane of the substrate, project beyond the respective semiconductor chip placed in the cutouts.

According to at least one embodiment of the method or one of its embodiments described above, incisions are formed in the substrate between the cutouts so that a plurality of optic carriers connected by a chip carrier is formed. The chip carrier extends in particular parallel to a main extension plane of the substrate and the optic carriers extend transversely, in particular perpendicularly, to this main extension plane. In particular, the semiconductor chips mounted in the cutouts are located on the chip carrier. Preferably, the semiconductor chips are spaced from the optic carriers. The incisions are formed, for example, by means of sawing.

According to at least one embodiment of the method or one of its embodiments described above, optical elements are bonded to the optic carriers in such a way that there is an optical element on each cutout. For example, an optical element is arranged downstream of each semiconductor chip in the radiation direction. In particular, intermediate spaces are formed between the optical elements. The intermediate spaces are arranged above the incisions, for example. This means that in the radiation direction, starting from the chip carrier, the intermediate spaces follow the incisions.

According to at least one embodiment of the method or one of its embodiments described above, the incisions and partially the intermediate spaces are filled with a potting. For example, the potting is applied by means of jetting or dispensing. For example, the potting is applied in a liquid state and subsequently cured. In particular, after curing, the potting is materially bonded to the optical element, the optic carrier and the chip carrier.

According to at least one embodiment of the method or one of its embodiments described above, the intermediate spaces are not completely filled with the potting after filling with the potting. It is possible that a meniscus, in particular a concave meniscus, is formed when the liquid potting material is applied.

According to at least one embodiment of the method or one of its embodiments described above, the composite with the chip carrier, the semiconductor chips, the optic carriers and the optical elements is cut through the potting along separation lines. In particular, the separation lines run in the incisions of the substrate. For example, the cutting is performed by means of sawing.

According to at least one embodiment of the method or one of its embodiments described above, the bonding of the optical elements is carried out with an adhesive layer. The adhesive layer is photochemically cured, for example. The adhesive layer is applied, for example, by means of stamping or dispensing or jetting.

Preferably, the adhesive layer is cured without the application of heat. In other words, the adhesive layer is cured by means of cold curing. For example, cold curing is performed at room temperature. For example, the adhesive layer is cured by irradiation with ultraviolet radiation. By photochemical curing, a hermetic seal of the cutout in which the semiconductor chip is arranged can be achieved comparatively easily.

Alternatively, it is also possible that the adhesive layer is at least partially thermally cured, for example. Furthermore, it is possible that the adhesive layer is cured, for example, using a combination of thermal and photochemical curing. Such a combined curing method is known from English, for example, as "snap-cure".

According to at least one embodiment of the method or one of its embodiments described above, the potting is thermally cured. In particular, the potting is cured by the supply of heat.

According to at least one embodiment of the method or one of its embodiments described above, the optical elements are provided in an optic composite. The optic composite is, for example, a glass wafer or a composite of microlenses. In particular, the optical elements are created from the optic composite by sawing with a profiled saw blade. For example, side surfaces of the optical elements are formed in such a way that after bonding the optical elements, the side surfaces are tilted towards the radiation direction as seen in the radiation direction. The profiled saw blade has a V-shaped profile, for example.

Alternatively, for example, the optical elements are generated from the optic composite in such a way that the optical elements have a straight saw edge. This means, in particular, that side surfaces of the optical elements are each perpendicular or essentially perpendicular to the front side and/or back side of the optical elements.

According to at least one embodiment of the method or one of its embodiments described above, the provided substrate comprises a plurality of voids between the cutouts. In particular, the formation of incisions in the substrate is carried out in a region of the voids, so that the resulting optic carriers each comprise a recess in the region of the voids. When the incisions are formed, the voids are opened in particular. For example, the voids are surrounded on all sides by the substrate.

According to at least one embodiment of the method or one of its embodiments described above, the incisions are first filled in the region of the exposed voids so that the recesses of the optic carriers are each completely filled with the potting. For example, the exposed voids form a channel in a direction transverse, in particular perpendicular, to the radiation direction, which is filled using capillary effects. Advantageously, air inclusions in the potting can be avoided by exploiting capillary effects. In particular, after filling the voids, the remaining intermediate spaces and inclusions are filled with the potting.

According to at least one embodiment of the method or one of its embodiments described above, providing the substrate comprises providing a base layer. A first layer is applied to the base layer. The first layer comprises first cavities. Thereby, the first cavities form the cutouts of the substrate. The first cavities penetrate the first layer in particular completely. In a plan view of the base layer, for example, the base layer is exposed in the first cavities.

According to at least one embodiment of the method or its embodiment last described, a second layer is arranged between the base layer and the first layer, the second layer comprises second and third cavities, the second cavities and the first cavities being congruent in a plan view of the base layer. For example, the second and third cavities each completely penetrate the second layer. In particular, the first and second cavities together form the cutouts of the substrate and the third cavities form the voids of the substrate. The base layer, for example, is formed as a simply connected layer. The first and second layers, for example, are formed multiply connected.

According to at least one embodiment of the method or one of its embodiments described above, the base layer, the first layer, and the second layer of the substrate are each at least one ceramic layer. For example, the layers are at least partially bonded together by firing. For example, the base layer, the first layer, and the second layer are bonded together in a common firing process. Alternatively, it is possible that the base layer is fired separately and the first layer and the second layer are fired together. In this case, the base layer is bonded to the first and second layers, for example by means of an adhesive.

Furthermore, it is possible that both the base layer and the first and/or second layer are formed from several ceramic sublayers.

According to at least one embodiment of the method or one of its embodiments described above, the base layer is formed with a lead frame. The base layer is connected to the first layer and the second layer. For example, the lead frame of the base layer is molded with a plastic potting as a potting body. The first layer and/or the second layer are, for example, ceramic layers and comprise, for example, AlO and/or AlN. In particular, the first layer and/or the second layer are fired. For example, firing bonds the first layer and the second layer together. The first layer and/or the second layer are subsequently bonded to the base layer in particular, for example by means of an adhesive.

A method of manufacturing an optoelectronic component is further disclosed, wherein the optic carrier is formed by the semiconductor chip.

In at least one embodiment of the method, the semiconductor chip is arranged on a chip carrier. The optical element is bonded to a surface of the semiconductor chip facing away from the chip carrier. Subsequently, the potting is applied to the carrier in such a way that flanks of the semiconductor chip and side surfaces of the optical element are covered by the potting. A front side of the optical element facing away from the carrier is in particular free of the potting. An adhesive layer is arranged between the semiconductor chip and the optical element, for example, by means of stamping or dispensing. The potting is applied, for example, using a film-assisted molding process, also known as FAM.

BRIEF DESCRIPTION OF THE DRAWINGS

Further advantageous embodiments and developments of the optoelectronic component and the method will become apparent from the exemplary embodiments described below in association with the schematic drawings. In and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

In the figures:

FIGS. 7 to 12A-12B and 16 show different method stages of a second exemplary embodiment of a method of manufacturing an optoelectronic component by means of sectional views.

DETAILED DESCRIPTION OF ILLUSTRATIVE EMBODIMENTS

Figure 1:
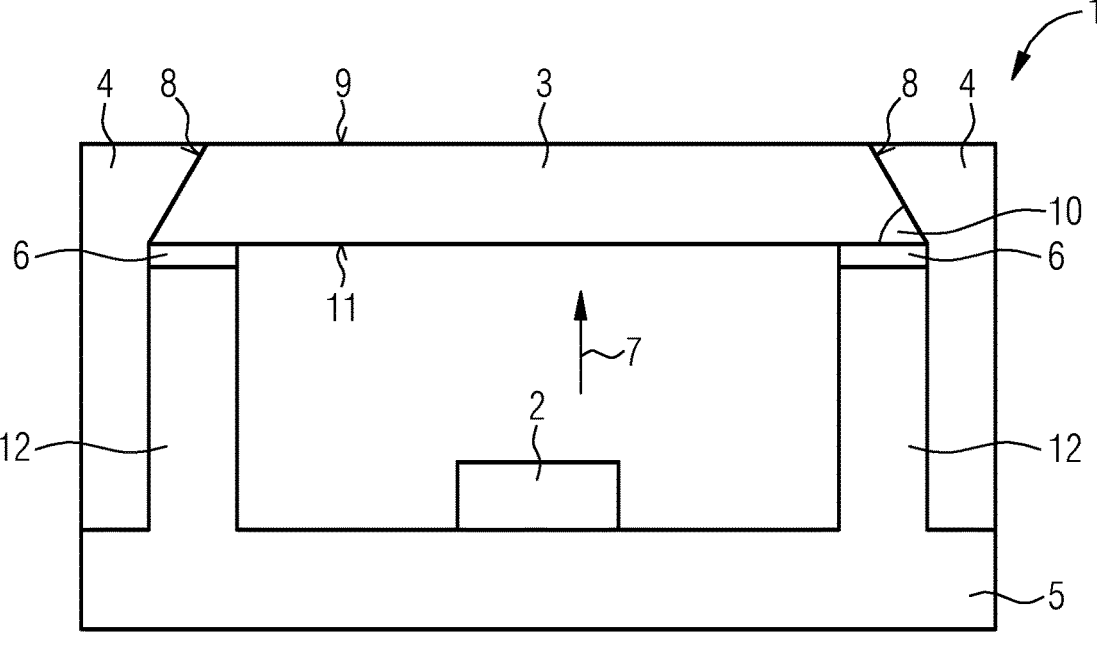
FIGS. 1 to 3 show exemplary embodiments of the optoelectronic component in sectional views perpendicular to its main extension plane.

The optoelectronic component 1 of FIG. 1 comprises an optoelectronic semiconductor chip 2. The optoelectronic semiconductor chip 2 is arranged on a chip carrier 5. The semiconductor chip 2 is bonded to the chip carrier 5, for example, by means of a silver conductive adhesive. The semiconductor chip 2 is configured to generate electromagnetic radiation, for example. The semiconductor chip 2 comprises, for example, a semiconductor layer sequence based on a III-V compound semiconductor material and comprises an active zone. In the intended operation, electromagnetic radiation is generated in particular in the active zone and emitted by the semiconductor chip 2 in radiation direction 7.

The semiconductor chip 2 is, for example, a light-emitting diode chip, called LED for short, or a laser diode chip, preferably a surface-emitting laser diode chip, called VCSEL for short.

Downstream of the semiconductor chip 2 in a radiation direction 7 is an optical element 3. The optical element 3 is, for example, a glass lens or a microlens array and is configured for beam shaping, in particular for beam expansion.

The optical element 3 is bonded to an optic carrier 12 with an adhesive layer 6. The adhesive layer 6 comprises, for example, a silicone-based adhesive. The optic carrier 12 and the chip carrier 5 are formed in one piece. For example, the chip carrier 5 and the optic carrier 12 are formed with a ceramic material, such as AlO or AlN. The semiconductor chip 2 is spaced apart from the optic carrier 12 and the optical element 3.

The optoelectronic component 1 of FIG. 1 also comprises a potting 4 which forms a frame around the optical element 3, the optic carrier 12 and the adhesive layer 6 which extends from the optical element 3 to the optic carrier 12. In the present case, the potting 4 also extends to the chip carrier 5. The potting 4 thus fixes the optical element 3 in its position relative to the semiconductor chip 2. The potting 4 is arranged directly at the optical element 3, the adhesive layer 6, the optic carrier 12 and the chip carrier 5.

To achieve stronger fixation, side surfaces 8 of the optical element 3 are at least partially tilted towards the radiation direction 7. In particular, the side surfaces 8 enclose an acute angle 10 with a back side 11 of the optical element 3 facing the semiconductor chip 2.

In intended operation, radiation emitted by the optoelectronic component 1 emerges in particular via a front side 9. The front side 9 of the optical element 3 is opposite to the back side 11. The front side 9 is free of the potting 4 and/or the adhesive layer 6. Thus, an influence of the adhesive layer 6 and/or the potting 4 on the emission properties of the optoelectronic component 1 can be reduced.

Figure 2:
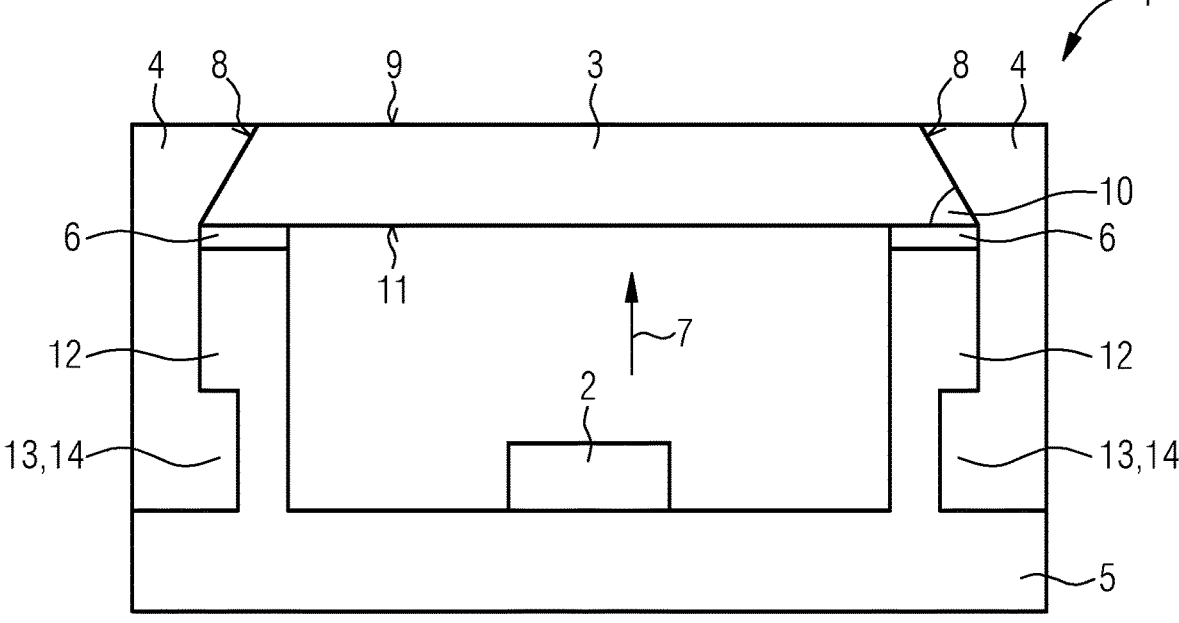

The optoelectronic component 1 of FIG. 2 comprises essentially the same features as the component 1 of FIG. 1, with the difference that the optic carrier 12 has a recess 13 on a side facing away from the semiconductor chip 2. The potting 4 has a protrusion 14 which engages in the recess 13. The protrusion 14 and the recess 13 are in particular corresponding to each other. The protrusion 14 completely fills the recess 13. This allows the mechanical stability of the optoelectronic component 1 to be further increased.

Figure 3:
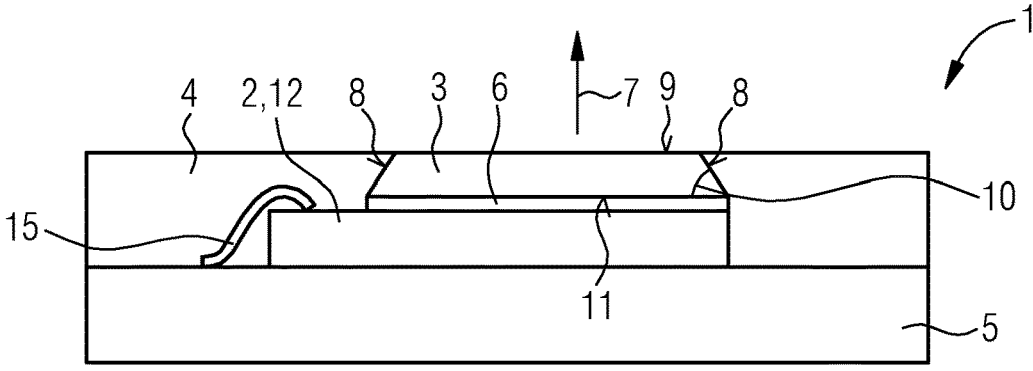

In the optoelectronic component 1 according to the exemplary embodiment of FIG. 3, the optic carrier 12 is formed by the semiconductor chip 2. The semiconductor chip 2 is arranged on a chip carrier 5. An optical element 3 is arranged on a side of the semiconductor chip 2 facing away from the chip carrier 5. An adhesive layer 6 is located between the semiconductor chip 2 and the optical element 3. The semiconductor chip 2 comprises, for example, the same features as the semiconductor chip 2 of FIGS. 1 and 2.

As in the exemplary embodiments of FIGS. 1 and 2, the optical element 3 is configured for beam shaping and comprises side surfaces 8 that are tilted toward the radiation direction 7 as viewed in a radiation direction 7. The front side 9 of the optical element 3, which faces away from the semiconductor chip 2, is free from a potting layer 4 and the adhesive layer 6.

In particular, the potting 4 is formed with the same materials as the potting 4 of the exemplary embodiments of FIGS. 1 and 2 and completely surrounds the semiconductor chip 2 in directions perpendicular to the radiation direction. Furthermore, substantially all outer surfaces of the semiconductor chip 2 that are not covered with the chip carrier 5 or the adhesive layer 6 are covered, in particular directly covered, by the potting 4.

In the intended operation, the chip carrier 5 serves as current supply energize and to drive the semiconductor chip

2. For example, the chip carrier 5 has one or more metallizations on a side facing the semiconductor chip 2, which are not shown in FIG. 3. Furthermore, it is possible that the chip carrier 5 has at least one through-connection, which is also not shown in the FIG. 3. In the intended operation, the semiconductor chip 2 of FIG. 3 is energized and controlled, for example, via the chip carrier 5 and via a bonding wire 15.

In particular, the chip carrier 5 of all exemplary embodiments is configured for electrical contacting of the semiconductor chip 2 as the chip carrier of FIG. 3.

Figure 4:
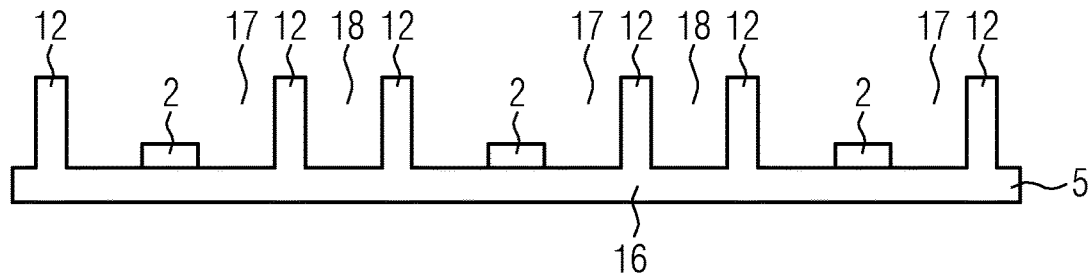
FIGS. 4 to 6 show different method stages of a first exemplary embodiment of a method of manufacturing an optoelectronic component by means of sectional views.
Figure 5:
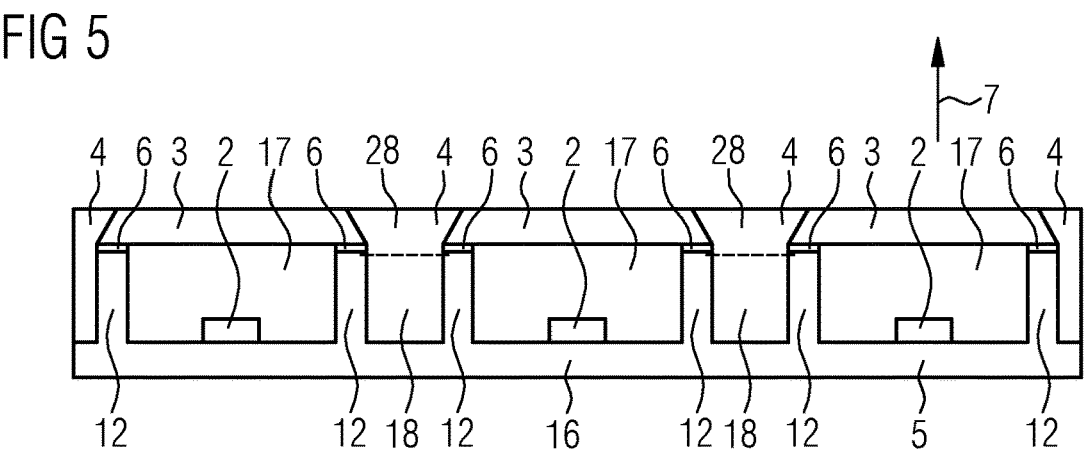
Figure 6:
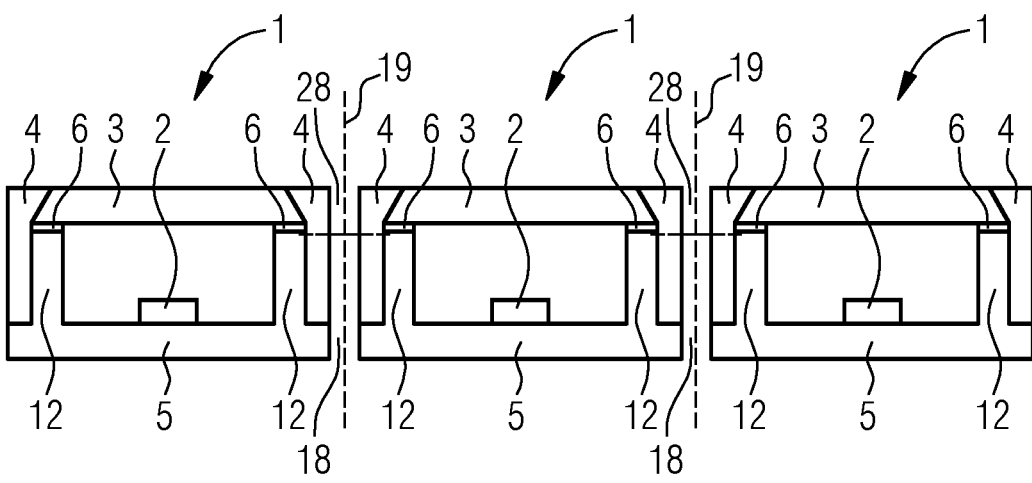

In the method according to FIGS. 4 to 6, a substrate 16 with a plurality of cutouts 17 is provided. Optoelectronic semiconductor chips 2 are arranged in the cutouts 17 (see FIG. 4). The semiconductor chips 2 are arranged in the cutouts 17 by means of silver conductive bonding or silver sintering, for example. Incisions 18 are formed between the cutouts 17. The cutouts 17 and incisions 18 are separated by optic carriers 12. The optic carriers 12 are mechanically connected to each other by a chip carrier 5. For example, the substrate 16 is sawn in the region of the incisions 18.

An adhesive layer 6 is subsequently applied to the optic carrier 12, for example by stamping or dispensing (see FIG. 5). Optical elements 3 are applied to the adhesive layer 6 and the adhesive layer 6 is cured. Intermediate spaces 28 are formed between the optical elements 3, which are arranged above the incisions 18 in the radiation direction 7. As can be seen in FIG. 5, the incisions 18 and the intermediate spaces 28 are subsequently filled with a potting 4. For example, a liquid potting means is introduced into the intermediate spaces 28 and incisions 18, for example by means of jetting or dispensing. Subsequently, the potting means is cured, for example thermally, so that the potting 4 is formed. The potting 4 comprises, for example, an epoxy or silicone filled with SiO2.

The chip carrier 5 is then completely cut through the potting 4 along separation lines 19 (see FIG. 6). The separation lines 19 run in the incisions 18 and the intermediate spaces 28. The cutting through is carried out, for example, by sawing. The cutting results in a plurality of optoelectronic components 1. The optoelectronic components 1 are, for example, each a component 1 according to the exemplary embodiment of FIG. 1.

The method according to a second exemplary embodiment, as illustrated in FIGS. 7 to 10, comprises essentially the same steps and features as the method of FIGS. 4 to 6. Different to the method of FIGS. 4 to 6, the provided substrate 16 comprises a plurality of voids 20 (see FIG. 7). In particular, the voids 20 are completely surrounded by the substrate 16. During the formation of the incisions 18, the voids 20 are opened (see FIG. 8). After the incisions 18 have been formed, the optic carriers 12 are each formed with a recess 13.

Figure 9:
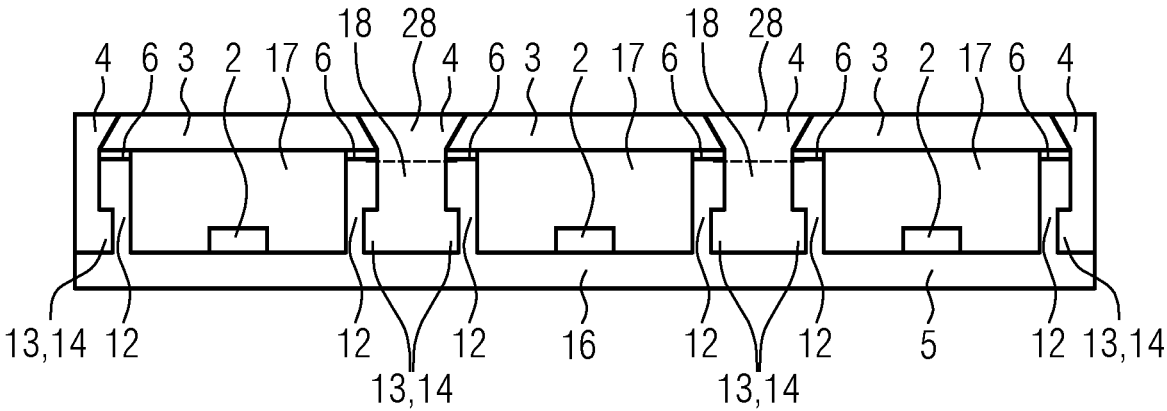
Figure 10:
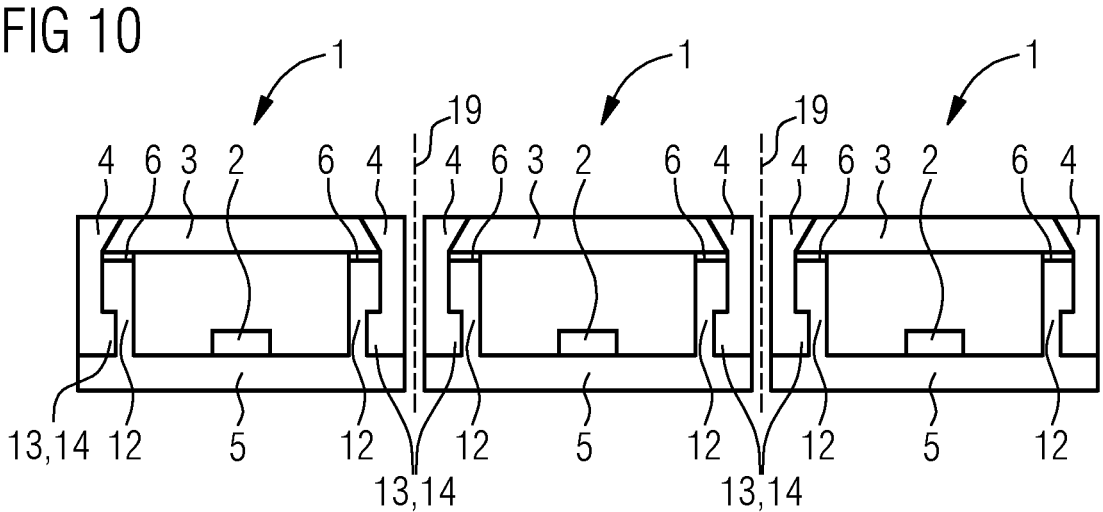

By filling the incisions 18 with the potting 4, the potting 4 has protrusions 14 which correspond to the recesses 13 (see FIG. 9). After the chip carrier 5 has been completely cut through, a plurality of optoelectronic components 1 is thus produced according to the exemplary embodiment of FIG. 2 (see FIG. 10).

Figure 11:
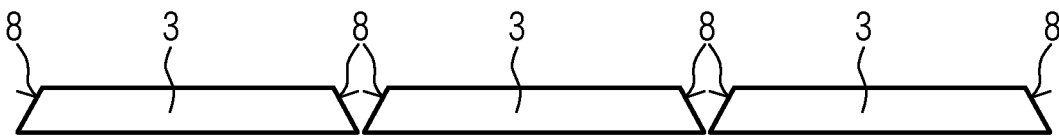

FIG. 11 illustrates a method step in which a plurality of optical elements 3 are produced from an optic composite. For example, an optic composite is cut with a profiled saw blade so that each of the optical elements 3 comprises an inclined side surfaces 8. In particular, the optical elements 3 of all exemplary embodiments can be generated from an optic composite.

Figure 12A:
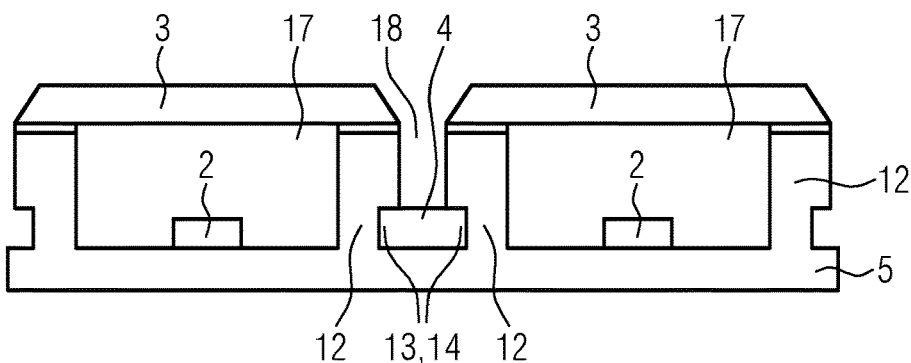
Figure 12B:
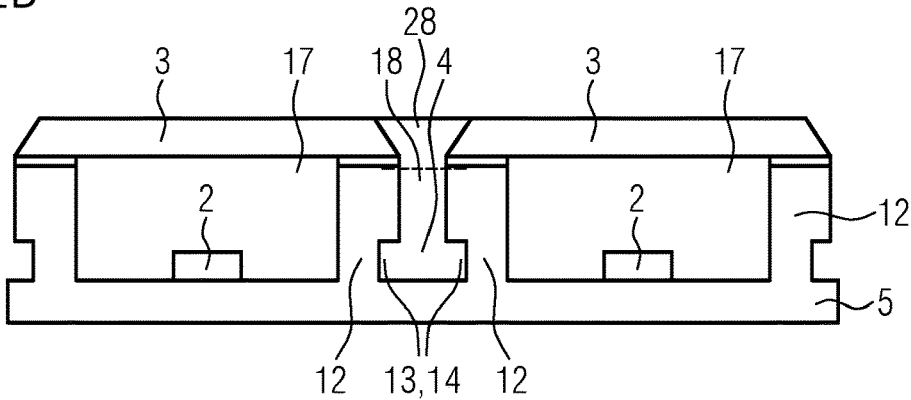

FIG. 12 illustrates a method step in which a potting 4 is introduced into an incision 18, wherein optic carriers 12 comprise recesses 13. In a first step, a liquid potting means is filled in the region of the recesses 13 (see FIG. 12A). Capillary forces are utilized so that air inclusions in the potting 4 can be reduced. Subsequently, the remaining incision 18 and an intermediate space 28 arranged above the incision 18 are filled with the potting 4 (see FIG. 12B).

Figure 7:
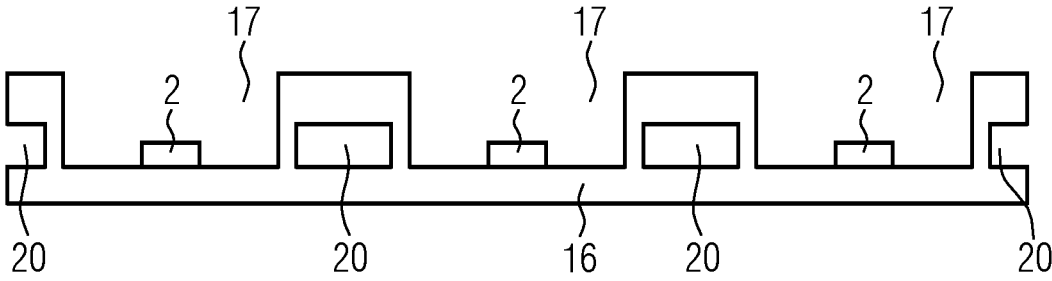
Figure 13:
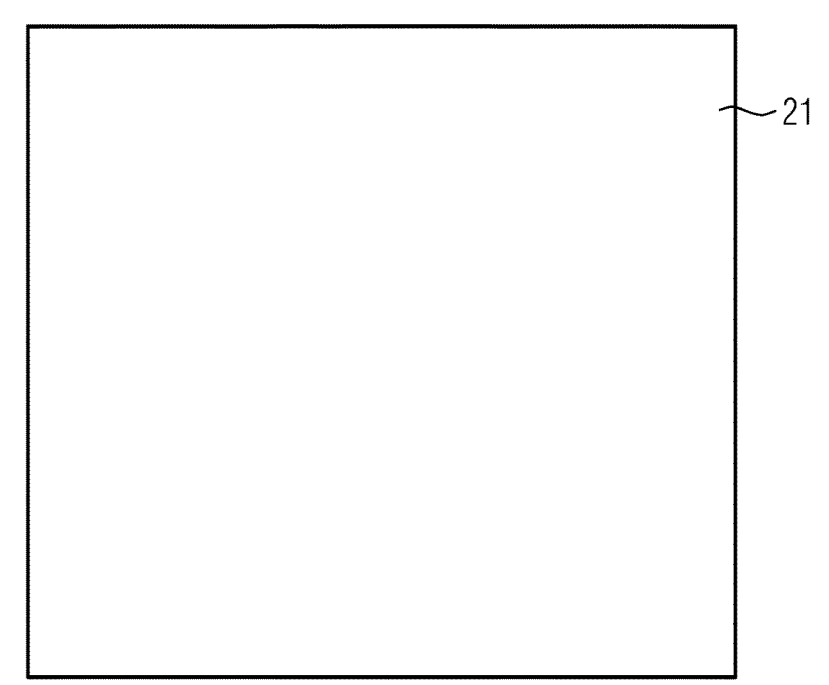
FIGS. 13 to 15 different stages of a method of manufacturing a substrate by means of plan views of the substrate.
Figures 14, 15:
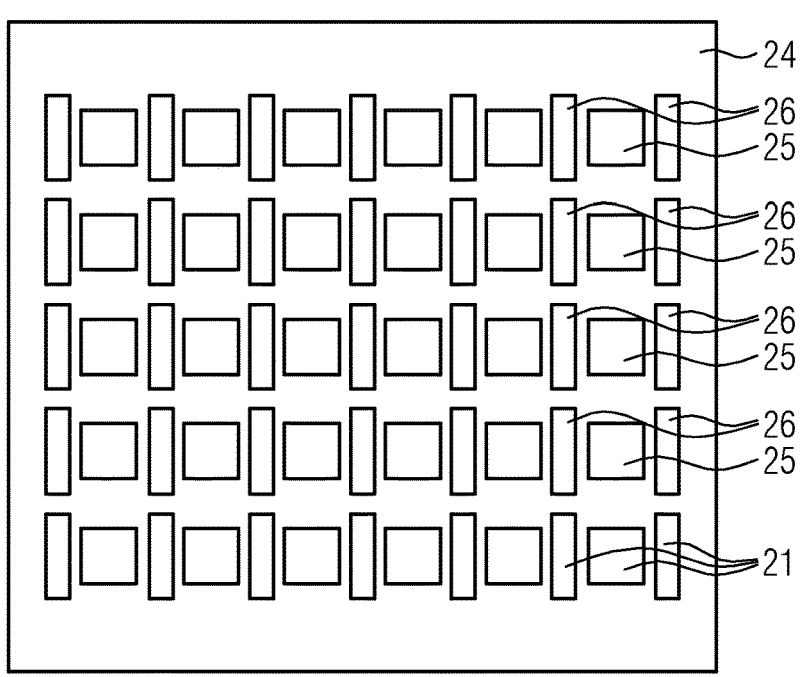

FIGS. 13 to 15 illustrate how a substrate is created, which is provided for example in FIG. 7. First, a base layer 21, for example made of a ceramic material such as AlN or AlO, is provided (see FIG. 13). The base layer comprises, for example, several ceramic sublayers, also called green bodies.

Subsequently, a second layer 24 is applied (see FIG. 14). The second layer 24 is formed, for example, from a ceramic material such as AlO or AlN and comprises, for example, several ceramic sublayers. In a plan view of the second layer 24, these partial layers are in particular congruent.

The second layer 24 comprises second cavities 25 and third cavities 26. The second and third cavities 25, 26 completely penetrate the second layer 24. In a plan view of the base layer 21, as shown in FIG. 14, the base layer 21 can be seen in the first and second cavities 25, 26.

Subsequently, a first layer 22 is applied to the second layer 24, so that the second layer 24 is arranged between the base layer 21 and the first layer 22 (see FIG. 15). The first layer 22 has first cavities 23 which, in a plan view of the base layer 21, are congruent with the second cavities 25 of the second layer 24. Thus, the base layer 21 can be seen in the first cavities 23. The first cavities 23 completely penetrate the first layer 22. The first layer 22 is formed, for example, with the same material as the second layer 24 and/or the base layer 21. The first layer 22 comprises, for example, like the second layer 24, a plurality of sub-layers which are congruent in a plan view of the first layer 22.

Subsequently, the base layer 21 and the first and second layers 22, 24 are connected, for example by firing (see FIG. 15). It is possible for all three layers 21, 22, 24 to be connected in a common firing process and for these to be connected to form a one-piece substrate 16.

Alternatively, it is possible, for example, for the first layer 22 and the second layer 24 to be connected separately to one another by firing and then applied to the base layer 21. In this case, the base layer 21 is fired independently of the first and second layers 22, 24. Firing of the base layer 21 is carried out, for example, before application of the second layer 24 (see FIG. 14). In this case, the first and second layers 22, 24 may be formed of a material that is different from the material of the base layer 21. For example, the first and second layers 22, 24 are formed with AlO and the base layer 21 is formed with AlN. Advantageously, ceramic layers made of AlO are less expensive to manufacture.

By connecting the base layer 21 of the first layer 22 and the second layer 24, a substrate 16 is created, which is shown in sectional view in FIG. 7, for example. Here, the first cavities 23 and the second cavities 25 together form cutouts 17 of the substrate 16, 17. The third cavities 26 form the voids 20.

Figure 8:
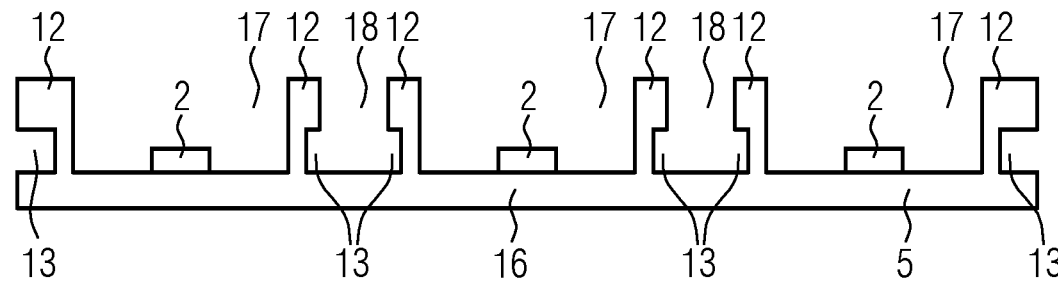
Figure 16:
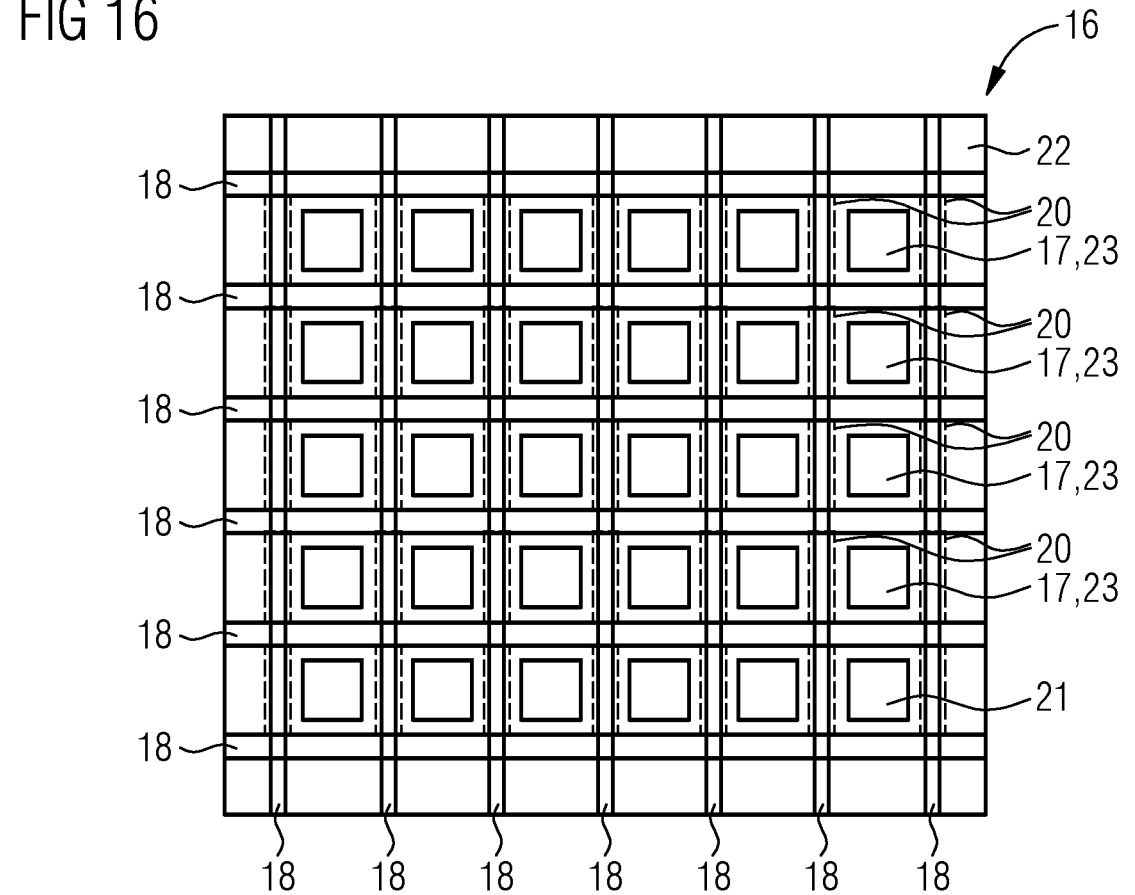

FIG. 16 illustrates in a plan view of the substrate 16 the method step illustrated in sectional view in FIG. 8. In FIG. 16, it can be seen that the incisions 18 in the substrate 16 used to form the optic carriers 12 and open the voids 20 run along grid lines of a regular rectangular grid.

Unless otherwise indicated, the components shown in the figures preferably follow one another directly in the sequence indicated. Layers which do not touch in the figures are preferably spaced apart. Insofar as lines are drawn parallel to one another, the corresponding surfaces are preferably also aligned parallel to one another. Also, unless otherwise indicated, the relative positions of the drawn components to each other are realistically reproduced in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic component comprising:
an optoelectronic semiconductor chip;
an optical element; and
a chip carrier,
wherein the semiconductor chip is arranged on the chip carrier,
wherein the optical element follows the semiconductor chip in a radiation direction of the semiconductor chip and is attached to an optic carrier by an adhesive layer,
wherein a potting forms a frame around the optical element, the optic carrier and the adhesive layer, the potting extending from the optical element to the optic carrier,
wherein the potting fixes the optical element in its position relative to the semiconductor chip,
wherein the optic carrier comprises at least one recess on a side facing away from the semiconductor chip, and
wherein the potting has at least one protrusion, which engages in the at least one recess of the optic carrier.

2. The optoelectronic component according to claim 1, wherein side surfaces of the optical element are at least partially tilted towards the radiation direction, seen in the radiation direction, and
wherein the potting is arranged on the side surfaces of the optical element.

3. The optoelectronic component according to claim 1, wherein a front side of the optical element is free of the adhesive layer and the potting.

4. The optoelectronic component according to claim 1, wherein the semiconductor chip is a surface-emitting light-emitting diode chip or a surface-emitting laser diode chip.

* * * * *